United States Patent
Sorig

[19]

[11] Patent Number: 5,944,538
[45] Date of Patent: *Aug. 31, 1999

[54] PIN SHAPED CONTACT ELEMENT

[75] Inventor: Ludger Sorig, Ascheberg, Germany

[73] Assignee: Leopold Kostal GmbH & Co. KG., Ludenscheid, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/942,654

[22] Filed: Oct. 2, 1997

Related U.S. Application Data

[63] Continuation of application No. 08/612,318, Mar. 7, 1996, abandoned.

[30] Foreign Application Priority Data

Mar. 8, 1995 [DE] Germany ............................ 195 08 133

[51] Int. Cl.$^6$ ................................................. H01R 13/428
[52] U.S. Cl. .............................................................. 439/82
[58] Field of Search ................................ 439/751, 82, 873

[56] References Cited

U.S. PATENT DOCUMENTS

| | | | |
|---|---|---|---|
| 4,737,114 | 4/1988 | Yaegashi | 439/751 |
| 4,769,907 | 9/1988 | Sebastien | 439/82 |
| 4,775,326 | 10/1988 | Lenaerts et al. | 439/751 |
| 4,795,378 | 1/1989 | Tomizu et al. | 439/751 |
| 5,564,954 | 10/1996 | Wurster | 439/82 |

FOREIGN PATENT DOCUMENTS

| | | | |
|---|---|---|---|
| 3220781 | 12/1983 | Germany | 439/751 |
| 3915644A1 | 11/1990 | Germany . | |

*Primary Examiner*—Gary F. Paumen
*Attorney, Agent, or Firm*—Brooks & Kushman P.C.

[57] ABSTRACT

A pin shaped contact element for contact-making fixing in metal coated holes of electric printed circuit boards. A press-in region is provided with a longitudinal hole and an adjacent connection region. To create a press-in region which produces an air tight electric connection between the coating of the hole and the press-in region during the pressing-in process and avoid chips forming from the metal coating, edge regions of the longitudinal sides of the two contact limbs extend at an acute angle to each other in a V shape. The limbs have a rounded shape. In each of the two sides, at least one longitudinal channel is integrally formed.

2 Claims, 2 Drawing Sheets

PIN SHAPED CONTACT ELEMENT

This is a continuation of copending application Ser. No. 08/612,318 filed on Mar. 7, 1996, now abandoned.

TECHNICAL FIELD

The present invention relates to a pin shaped contact element for contact-making fixing in metal coated holes in electric printed circuit boards.

BACKGROUND ART

Pin shaped contact elements are provided to form, by being pressed into metal coated holes of electric printed circuit boards, an electrically conductive connection to at least one track of an electric printed circuit board. By means of the contact pin- or contact bushing-like connection region of the contact element it is possible, for example, for electric/electronic devices or connection devices to be connected to the track or tracks. For problem-free contacting of the metal coated holes, their manufacturing tolerances must be compensated by corresponding formation of a press-in region of the contact element so that an air-tight connection is ensured between the hole and the press-in region.

For this reason the press-in regions of such contact elements are often formed so as to be flexibly deformable against a corresponding force. This is achieved, for example, by means of a longitudinal hole stamped into the press-in region and formed as a needle eye, because two contact limbs are formed thereby which can be moved towards each other in a resiliently elastic manner. By means of the resiliently elastic formation of the contact limbs, it is ensured that the normal manufacturing tolerances can be overcome and therefore sufficient contact force is available for an air-tight electrical connection.

A pin shaped contact element is known from DE 39 15 644 A1. The press-in region of this contact element is, however, not only formed with relatively sharp edges but also comprises portions where the two longitudinal sides of the contact limbs are disposed extending at a relatively shallow angle to each other. If such a contact element is pressed into the hole of an electric printed circuit board, material of the metal coating is inevitably displaced. Between the smooth longitudinal sides of the two contact limbs and the wall of the hole only little space remains to receive the displaced material of the coating, which usually consists of tin. It is possible that during pressing-in, in particular in the case of unfavorable tolerances, the metal coating may be damaged so badly that it is chipped off. If such chips, consisting, for example, of tin, fall into electric/electronic devices provided with printed circuit board assemblies of this type, the devices may fail.

SUMMARY OF THE INVENTION

It is therefore the object of the present invention to develop a press-in region for a pin shaped contact element for contact-making fixing in metal coated holes of electric printed circuit boards in such a way that because of its shape, an air-tight electrical connection between the metal coating of the hole and the press-in region is produced during the pressing-in process and it is also ensured that during the pressing-in process no chips are formed from the metal coating.

The object is achieved in accordance with the invention by a pin shaped contact element for contact-making fixing in metal coated holes of electric printed circuit boards. The invention includes a connection region, and a press-in region which cooperates with a hole in the printed circuit boards. The connection region has an underside facing the electric printed circuit board. The press-in region has a needle eye-like longitudinal hole provided so that two contact limbs, which move toward each other in a resiliently elastic manner, are formed. The contact limbs have outer longitudinal sides facing away from each other that come to bear against a wall of the hole, thus producing hole-face forces. The longitudinal sides of the two contact limbs include edge regions extending at an acute angle to each other in a V shape and have a rounded shape. At least one channel is integrally formed in each of the two longitudinal sides of the contact limbs and extend in a longitudinal direction.

It is an advantage with such a formation that by means of the comparatively short resiliently elastic press-in region the tolerances normally arising in holes of electric printed circuit boards can be compensated in a particularly reliable manner. Furthermore, good use is made, because of the relatively short press-in region, of the often confined construction space in electric/electronic devices.

Further advantageous embodiments of the subject matter of the invention are given in the dependent claims. The invention is described in more detail with the aid of an embodiment illustrated in the drawings.

BEST MODE(S) FOR CARRYING OUT THE INVENTION

Figure 1:
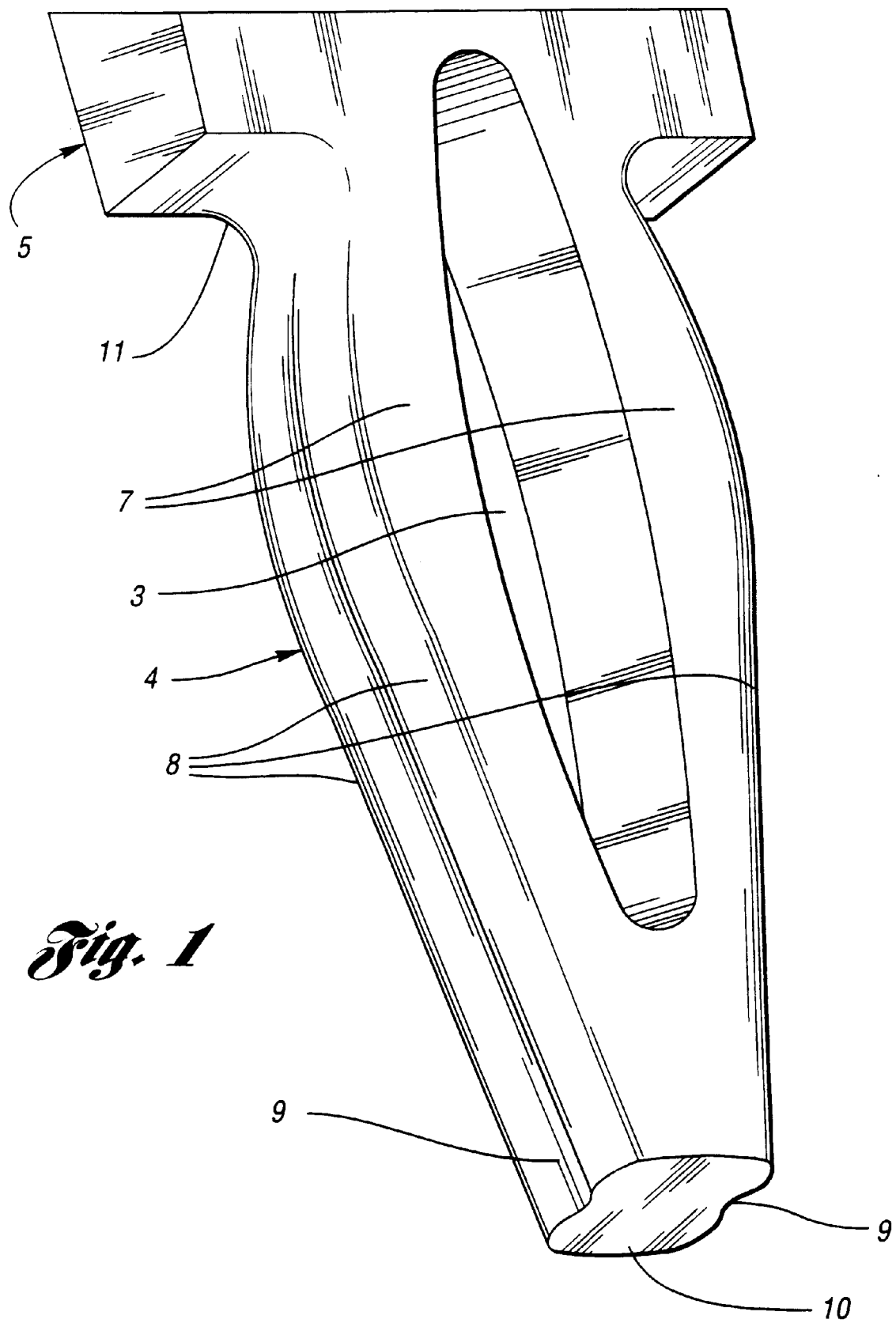
FIG. 1 three-dimensionally illustrates a pin shaped contact element.

As is evident from the drawings, a pin shaped contact element for contact-making fixing in metal coated holes 1 of electric printed circuit boards 2 includes a press-in region 4, provided with a longitudinal hole 3, adjoining a connection region 5.

Figure 2:
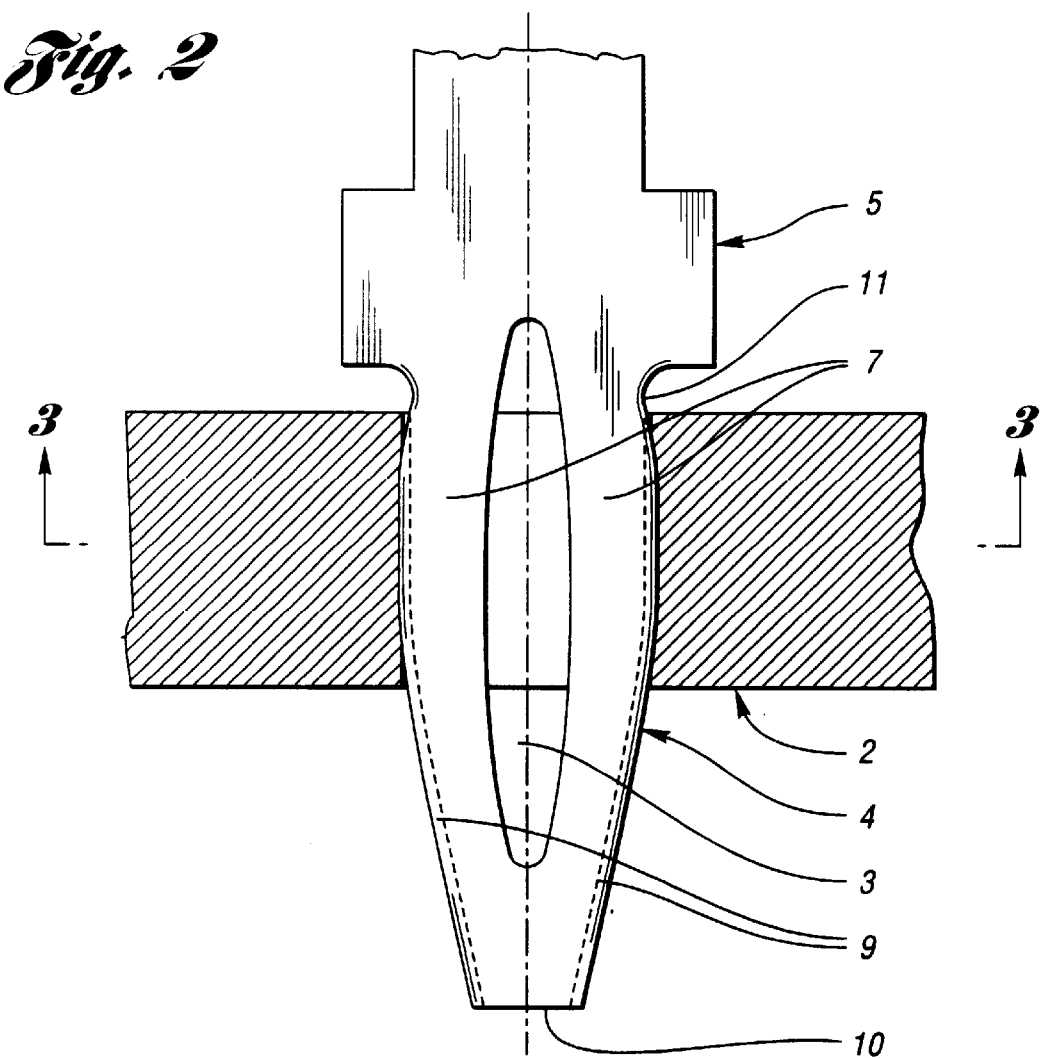
FIG. 2 illustrates a cross-sectional view of a contact element in accordance with FIG. 1 pressed into a hole of an electric printed circuit board.
Figure 3:
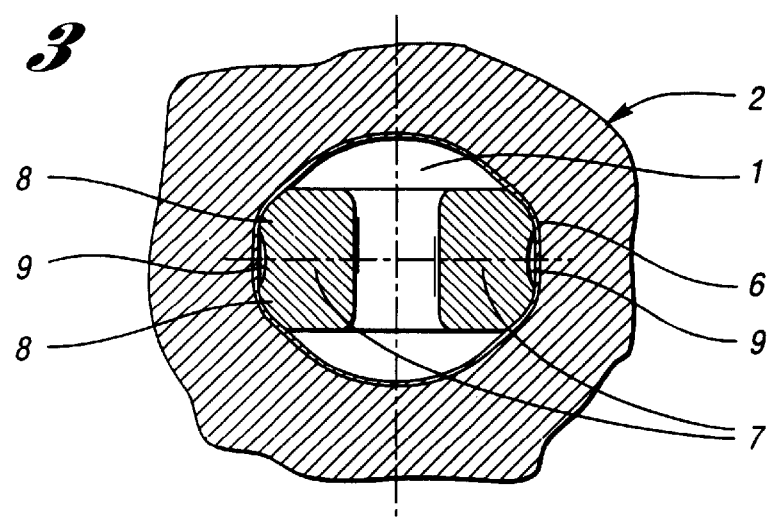
FIG. 3 illustrates a cross-sectional view of a contact element along the line A—A of FIG. 2.

As is particularly evident from FIG. 2 and FIG. 3 the hole 1 for electrically conductive connection to the contact element is provided with a metal coating 6. This metal coating 6 is tin because of its good contact and adherence qualities and its relatively low price. In order that an air-tight electric connection is produced between the tin coating of the hole 1 and the similarly tin coated surface of the press-in region 4 a certain hole-face force must be exerted on the wall of the hole 1 by the press-in region 4. The necessary force applied to the face of the hole is produced during the pressing-in process by the two contact limbs 7 of the press-in region 4 which are pressed together in a resiliently elastic manner.

As is particularly evident from FIG. 1 a needle eye-like longitudinal hole 3 is provided in the press-in region 4. The longitudinal hole 3 is formed in the press-in region 4 by a punching process, wherein the two contact limbs 7 are produced. The four edge regions 8 of the two contact limbs 7 which come to lie against the wall of the hole 1 comprise a clearly rounded shape, wherein the radius of the edge regions 8 corresponds approximately to the radius of the hole 1. This rounded shape of the edge regions 8 is produced by a stamping process.

A channel 9 extending in the longitudinal direction is formed in both longitudinal sides of the contact limbs 7 and is provided to receive material displaced during the pressing-in process. Both the channels 9 are also produced by a stamping process. The displaced material may be the tin of the coating of the hole 1 or the tin of the metal coating of the press-in region 4.

Both channels 9 extend over the whole length of the longitudinal sides of the contact limbs 7 and thus divide the longitudinal sides into two equally sized contact ridges extending in the longitudinal direction.

In order that no sharp-edged regions are produced both channels 9 are formed with a circle-segment shaped cross-section and pass gradually into the two respective adjoining contact ridges of the two contact limbs 7.

In order to achieve a particularly good resilient elasticity for the two contact limbs 7 over a short length, the needle eye-like longitudinal hole 3 extends from close to the free end 10 of the press-in region 4 into the underside of the connection region 5. The portion from the free end 10 to the beginning of the longitudinal hole 3 makes up only about 20% and the portion of the longitudinal hole 3 penetrating into the connection region 5 makes up at least 10% of the entire length of the press-in region 4. Furthermore, the contour of the longitudinal hole 3 and the extension of the longitudinal sides of the two contact limbs 7 are determined with respect to each other in such a way that the cross-section of each of the two contact limbs 7 is formed to be continually increasing approximately from the beginning of the longitudinal hole 3 until a maximum cross-section is achieved. From the maximum cross-section each of the two contact limbs 7 continually decreases again until an adjoining transition zone 11 is reached in order in the transition zone 11, which is kept short, to be formed again increasing continually until a connection region 5 is reached. The two longitudinal sides of the two contact limbs 7 therefore comprise a substantially bow shaped extension wherein the two longitudinal sides are disposed extending in a V shape at an acute angle of less than 35° to each other until the maximum cross-section is reached.

The first step when pressing in the contact element is, without exerting hole-face forces, to place the free end 10 of the press-in region 4 in the hole 1 of the printed circuit board 2. As the two contact limbs 7 are disposed extending at an acute angle to each other a continuous relatively slow increase in the hole-face forces exerted takes place as pressing-in continues. This goes on until at the full insertion depth of the contact element the most widely expanded region of the press-in region 4 comes to lie in the hole 1. At the fullest insertion depth the underside of the connection region 5 facing the press-in region 4 faces a main surface of the electric printed circuit board 2 but does not bear against it.

A continuous slow increase in the hole-face forces during the pressing-in process also occurs due to the shape of the longitudinal hole 3 and the formation of the cross-section of the two contact limbs 7, already described in detail.

The tin of the coating of the hole 1 and of the press-in region 4, which is displaced during the pressing-in process, can be well received by the two channels 9. By means of the aforementioned shaping of the press-in region 4 and of the use of tin as a coating material, a strong force for holding the contact elements in their holes 1 is produced in spite of the high elasticity of the contact limbs 7. Therefore in operation the contact elements are held securely against undesired removal in the holes 1 of the printed circuit board 2.

All in all, a press-in region 4 is thereby produced which also ensures reliable air-tight contacting even in the case of unfavorable tolerances in the hole 1 and the press-in region 4, and whereby it is also effectively prevented that chips are formed from the metal coatings.

While the best mode for carrying out the invention has been described in detail, those familiar with the art to which this invention relates will recognize various alternative designs and embodiments for practicing the invention as defined by the following claims.

What is claimed is:

1. A pin shaped contact element for a tin coated circular hole (1) of an electrical printed circuit board (2), the contact element comprising:

a connection region (5);

a free end region (10);

a tin coated press-in region (4) mountable in the circular hole (1) of the printed circuit board (2), the press-in region (4) adjoining the connection region (5) and the free end region (10), the press-in region (4) having a pair of curvilinear, bow shaped contact limbs (7) separated by a needle eye-like longitudinal hole (3) extending from within the connection region (5) to the free end region (10), wherein the portion of the longitudinal hole (3) within the connection region (5) makes up at least 10% of the length of the press-in region (4), the longitudinal hole (3) having a maximum width adjacent to the circuit board to permit uninterrupted inward deflection of the contact limbs (7) caused by point contact between the contact limbs (7) with the circular hole (1) during insertion of the press-in region (4) through the circular hole (1), wherein the contact limbs (7) are elastically inwardly deformable to generate a retaining force for holding the press-in region (4) in the circular hole (1) after the press-in region (4) is inserted through the circular hole (1), wherein the longitudinal hole (3) and the contact limbs (7) cooperate such that the cross-section of the contact limbs (7) continually increases from the longitudinal hole (3) near the free end region (10) of the press-in region (4) until a maximum cross-section is reached, and continually decreases from the maximum cross-section until the underside of the connection region (5) is reached to which the point contact is confined after insertion, so that the contact limbs( 7) have a sufficient resiliency to generate the retaining force over a relatively short length, the retaining force having the characteristic of increasing initially in proportion to depth of insertion, and then becoming relatively constant with added depth of insertion to facilitate assembly;

the contact limbs (7) having outer longitudinal sides provided with a pair of edge regions (8), the pair of edge regions (8) having a substantially rounded, equally sized circular shape corresponding to the shape of the circular hole (1) and are engageable in an air-tight relationship with a portion of the hole (1), wherein the longitudinal sides extend in a V-shaped acute angle of less than 35 degrees with respect to each other from the free end region (10) until the maximum cross-section is reached at the point contact between the longitudinal sides of the contact limbs (7) and the circular hole (1); and a channel (9) integrally formed in each of the longitudinal sides of the contact limbs (7) between each pair of edge regions (8) extending over the length of the longitudinal sides of the contact limbs (7) for receiving displaced tin from the contact element and the circular hole (1) of the printed circuit board (2) when the press-in region (4) is mounted in the circular hole (1).

2. A pin shaped contact element according to claim 1, wherein a transition zone (11) is integrally formed proximate an underside of the connection region (5) on each of the two contact limbs (7), in which zone the cross-section of the two contact limbs (7) continuously increases.

* * * * *